(12) United States Patent
Oono et al.

(10) Patent No.: US 6,384,428 B1
(45) Date of Patent: May 7, 2002

(54) SILICON CARBIDE SEMICONDUCTOR SWITCHING DEVICE

(75) Inventors: Toshiyuki Oono; Takayuki Iwasaki; Tsutomu Yatsuo, all of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/646,305

(22) PCT Filed: Mar. 19, 1998

(86) PCT No.: PCT/JP98/01185

§ 371 Date: Sep. 15, 2000

§ 102(e) Date: Sep. 15, 2000

(87) PCT Pub. No.: WO99/48153

PCT Pub. Date: Sep. 23, 1999

(51) Int. Cl.⁷ .......................................... H01L 31/0312
(52) U.S. Cl. ........................ 257/77; 257/279; 257/628
(58) Field of Search ........................ 257/77, 279, 627, 257/628

(56) References Cited

U.S. PATENT DOCUMENTS 5,736,753 A * 4/1998 Ohno et al. .................. 257/77
5,744,826 A * 4/1998 Takeuchi et al. .............. 257/77
5,976,936 A * 11/1999 Miyajima et al. ............ 438/268

FOREIGN PATENT DOCUMENTS

| JP | 6-151860 | 5/1994 |
| JP | 7-131016 | 5/1995 |
| JP | 10-107263 | 4/1998 |

\* cited by examiner

*Primary Examiner*—Sara Crane
(74) *Attorney, Agent, or Firm*—Antonelli, Terry, Stout & Kraus, LLP

(57) ABSTRACT

The present semiconductor switching device comprises a silicon carbide single crystal of hexagonal symmetry having a first conductive type and a semiconductor region of a second conductive type opposite to the first conductive type and locating in the silicon carbide single crystal. The silicon carbide single crystal of the first conductive type and the semiconductor region of the seconductive type form a pn junction. The pn junction interface has an interface extended in the depth direction from the surface of the silicon carbide single crystal, and the interface includes a crystal plane in parallel to the <11$\underline{2}$0> orientation of the silicon carbide single crystal or approximately in parallel thereto, thereby reducing the leak current.

10 Claims, 9 Drawing Sheets

0.5μm 0.5μm 0.5μm 0.5μm

SILICON CARBIDE SEMICONDUCTOR SWITCHING DEVICE

TECHNICAL FIELD

The present invention relates to a semiconductor switching device using silicon carbide.

BACKGROUND ART

Silicon carbide (SiC) has been now regarded as an important material for semiconductor switching devices applicable to circumstances to which silicon is hardly applicable or semiconductor devices with such properties that silicon cannot attain.

Silicon carbide has a band gap about three times as large as that of silicon and thus is applicable to considerably higher temperatures than the application limit temperature (150° C.) of silicon. Furthermore, silicon carbide has a larger dielectric breakdown voltage, e.g. larger by approximately one order of magnitute, and thus can reduce the resistance of a power semiconductor device designed for constant voltage-withstand to one-tenth or less than that of silicon device.

These distinguished properties of silicon carbide are all due to a very strong bounding force between carbon and silicon in the silicon carbide crystal, which, on the other hand, brings about various problems in processes for forming semiconductor devices, though.

For example, in case of forming a semiconductor region of counter-conductive type on parts of p- or n-type semiconductor crystal substrate surface, a diffusion process is usually used in case of silicon, but in case of silicon carbide the diffusion rate of impurity elements in the crystal is very low because of the strong bonding and thus the diffusion process, when applied to silicon carbide, will require high temperatures such as 2,000° C. or higher and a long processing time, rendering its practical application substantially impossible. In case of producing a semiconductor device based on silicon carbide, the so called ion implantation process is used, which implants ions of necessary elements for forming a semiconductor region through openings of a mask coated on a semiconductor crystal substrate surface under an acceleration voltage of a few tens to a few hundred kV, as disclosed in JP-A-6-151860.

However, in the ion implantation process, many defects are introduced into the crystal during the implantation, causing another problem. To improve the defects and activate impurity elements in the implanted layer, a heat treatment is usually carried out. In case of silicon carbide, the heat treatment is carried out at high temperatures e.g. 1,400° C. to 1,700° C. but, as disclosed, for example, in Silicon Carbide and Related Materials 1995 (Proceedings of the Sixth International Conference), p. 513, many defects still remain even after the heat treatment. The residual defects are a cause of leak current when an inverse voltage is applied to the pn junction of a semiconductor switching device based on silicon carbide.

DISCLOSURE OF THE INVENTION

The present semiconductor switching device comprises a silicon carbide single crystal of hexagonal symmetry having a first conductive type (p- or n-type) and a semiconductor region having a second conductive type opposite to the first conductive type and locating in the silicon carbide single crystal. A pn junction is formed between the silicon carbide single crystal of first conductive type and the semiconductor region of second conductor type. The pn junction interface includes an interface extended in the depth direction from the surface of silicon carbide single crystal, and the extended interface includes a crystal plane in parallel to the <11$\underline{2}$0> orientation of silicon carbide single crystal or approximately in parallel thereto, where the underline given below the orientation index "2" has the same meaning as that of "−" given above the index in the conventional crystallographic rotation. As will be described later, in the semiconductor region of second conductive type, crystal defects formed on the crystal plane in parallel to the <11$\underline{2}$0> orientation or approximately in parallel thereto with a deviation therefrom within an angle of a few degrees are smaller in size than those formed on other crystal planes, and thus the leak current density generated on the crystal plane in parallel to the <11$\underline{2}$0> or approximately, in parallel thereto is lower than that generated on other crystal planes. That is, the inclusion of the crystal plane in parallel to the <11$\underline{2}$0> orientation or approximately in parallel thereto in the pn junction interface can reduce the leak current in the semiconductor device based on the silicon carbide single crystal.

Having made detailed observations of defects remaining in the silicon carbide single crystal after the introduction of impurity by ion implantation, etc., the present inventors have newly found in that the defects in the hexagonal silicon carbide single crystal were in the following states: observations from different directions of cross-sections of impurity layer formed in the silicon carbide single crystal revealed that the state and distribution of defects as observed differed from one direction to another and the defect size was larger when observed from the <11$\underline{2}$0> orientation of crystallographic orientation index of silicon carbide single crystal, whereas the defect size was smaller or substantially unobservable, when observed from the <1100> orientation.

FIG. 1(a), (b) and (c) are structural views showing the respective crystal planes {0001}, {1100} and the respective orientations <1100> and <11$\underline{2}$0> in unit lattice of hexagonal silicon carbide single crystal, where the orientations <1100> and <11$\underline{2}$0> are perpendicular to the planes {1100} and {11$\underline{2}$0}, respectively. Angle of the <11$\underline{2}$0> orientation to the <1100> orientation is 90 degrees or 30 degrees.

It is preferable that a proportion of the crystal plane in parallel to the <11$\underline{2}$0> orientation of silicon carbide single crystal or approximately in parallel thereto, which is included in the pn junction interface extended in the depth direction from the surface of silicon carbide single crystal, is larger. According to the present inventions' study, it is preferable that the proportion is larger than a half of the entire interface extended in the depth direction from the surface of silicon carbide single crystal at the pn junction interface.

The present invention is applicable to such a semiconductor switching device having a pn junction that a depletion layer is extended from the pn junction in a working state or a blocking state. Furthermore, the present invention is also applicable to a semiconductor switching device having a pn junction for injecting carriers into the semiconductor switching device. In that case, the present invention is effective for improving the carrier injection efficiency at the pn junction and reducing the on-state voltage or power loss of the semiconductor switching device.

BEST MODES FOR CARRYING OUT THE INVENTION

Figure 1:
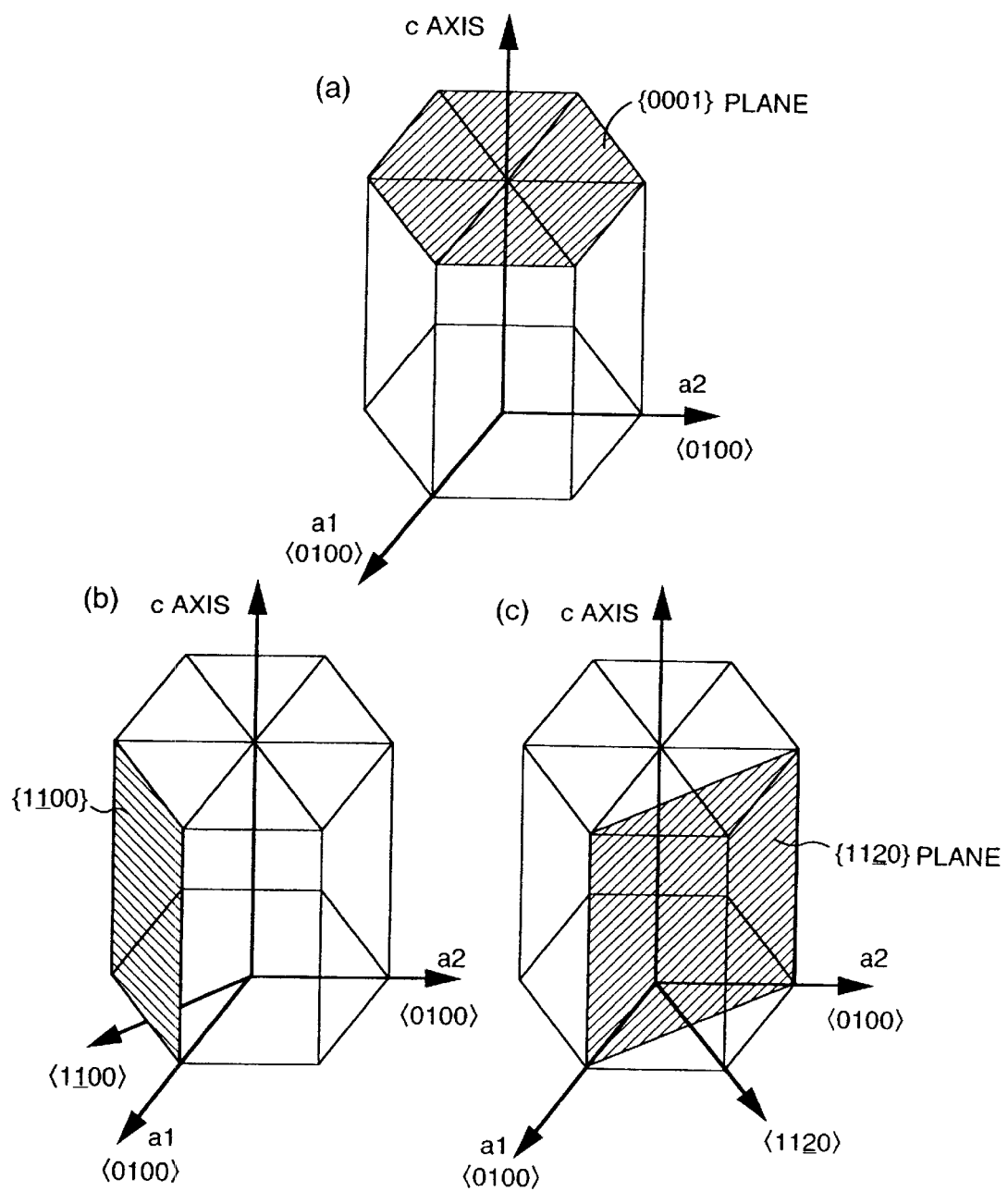
FIG. 1 is structural views each showing crystal planes and crystal orientations in the unit lattice of hexagonal silicon carbide single crystal.
Figure 2A:
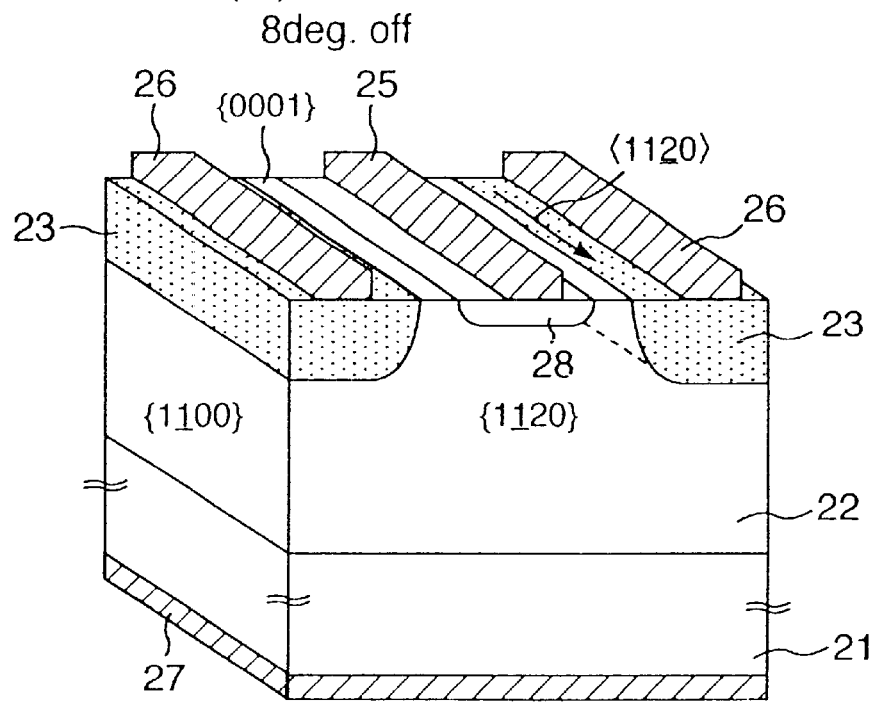
FIG. 2 are a perspective view and a plan view of a junction-gate field effect transistor, respectively, according to the present invention.
Figure 2B:
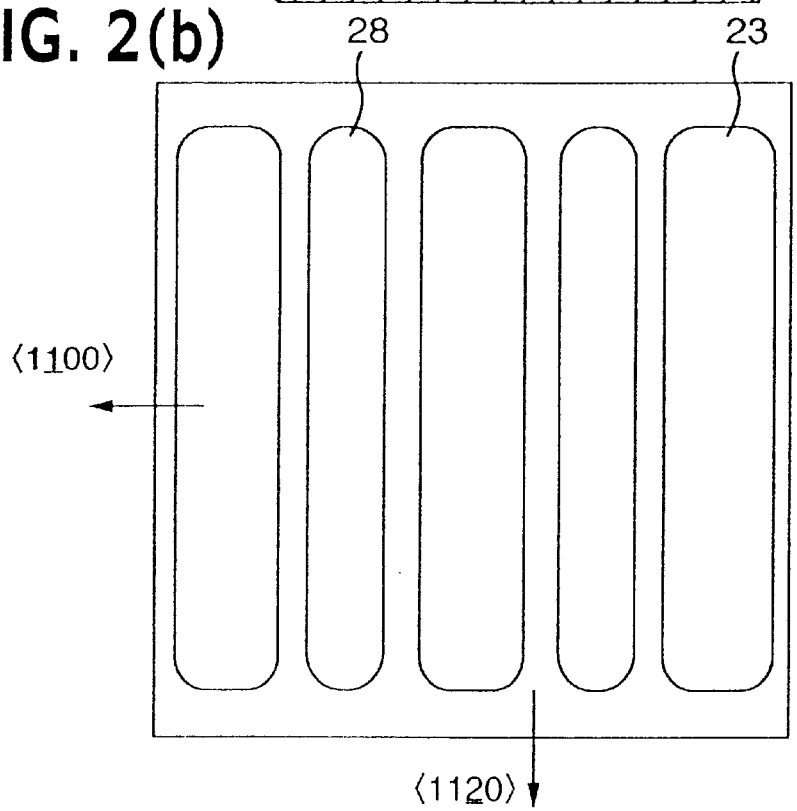

FIG. 2 are a perspective view of a junction-gate field effect transistor according to the present invention and a plan view showing only a semiconductor region. In the present embodiment, a transistor is formed on the basis of hexagonal 4H—SiC as a semiconductor material. A drift layer 22 of high resistance n type (n-type) is provided on a silicon carbide single crystal wafer 21 of low resistance n type ($n^+$ type) by epitaxial growth. Gate layer 23 of p type is provided on part of the surface of the drift layer by aluminum ion implantation, so that the principal pn junction plane, which is not in parallel to the interface between the drift layer 22 and the gate layer 23, can be in parallel to the <11$\underline{2}$0> orientation of 4H—SiC. An $n^+$ type source layer 28 is provided on other part of the surface of the drift layer 22 by nitrogen ion implantation. A source electrode 25 is through into ohmic contact with the source layer 28, whereas a drain electrode 27 is brought into ohmic contact with the back side of the $n^+$ type water 21. Furthermore, a gate electrode 26 is provided on the gate layer 23.

Figure 3A:
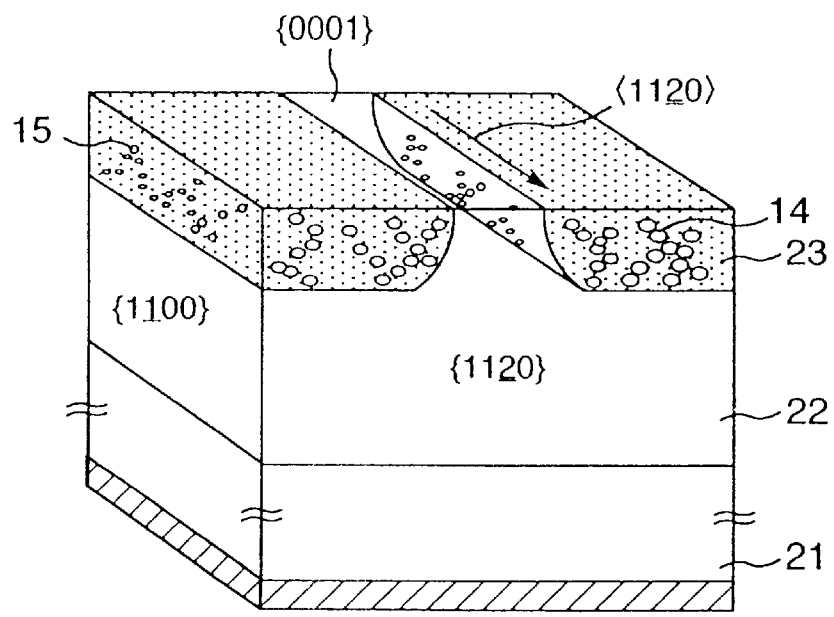
FIG. 3 is a perspective view showing the state of crystal defects in the gate layer of the junction-gate field effect transistor of FIG. 2, and its plan view.
Figure 3B:
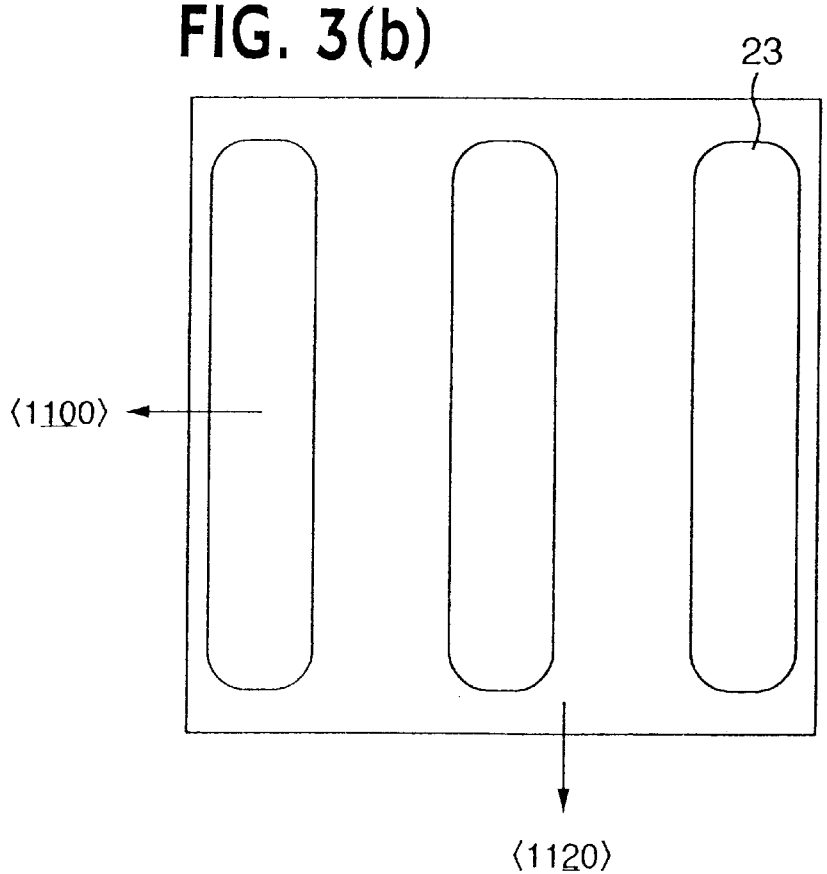

FIG. 3 is a perspective view showing the state of crystal defects in the gate layer 23 of the junction-gate field effect transistor of FIG. 2 and its plan view. In FIG. 3, the $n^+$ type source layer 28, the source electrode 25 and the gate electrode 26 of FIG. 2 are omitted for simplicity.

Figure 4A:
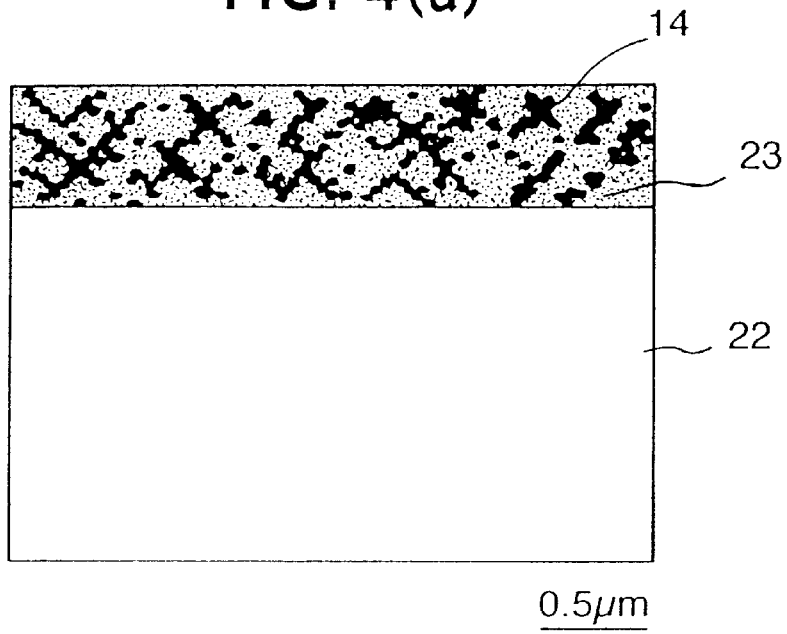
FIG. 4 is cross-sectional views each showing only the pn junction comprising a drift layer and a gate layer, respectively, in FIG. 2 and FIG. 3.
Figure 4B:
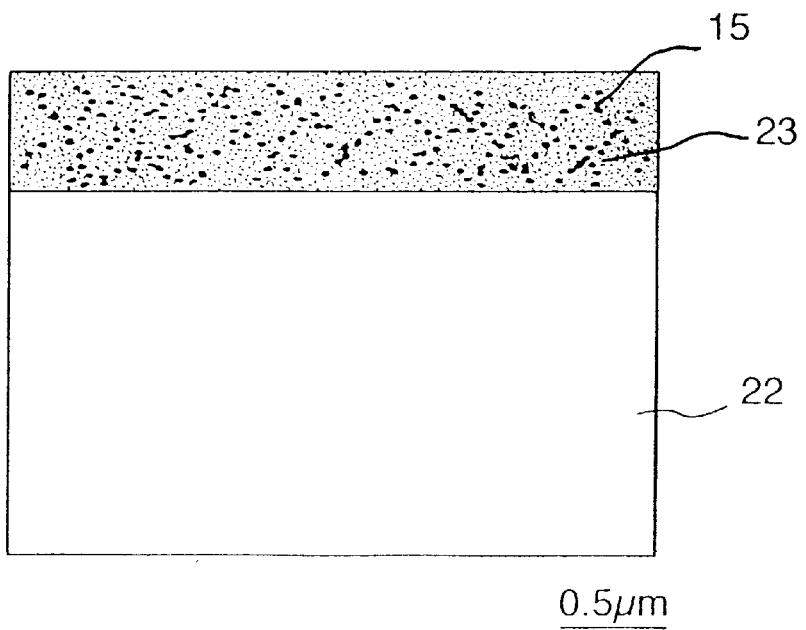

As shown in the perspective view of FIG. 3, crystal defects 15 formed on the crystal plane in parallel to the <11$\underline{2}$0> orientation of 4H—SiC are smaller than crystal defects 14 formed on the crystal plane perpendicular to the <11$\underline{2}$0> orientation in the gate layer 23. Cross-sectional views of only a pn junction comprising the drift layer 22 and the gate layer 23 of FIGS. 2 and 3 are shown in FIG. 4, where (a) refers to observation from the <11$\underline{2}$0> orientation of silicon carbide single crystal and (b) refers to observation from the <1100> orientation. To form the pn junction, a wafer of $n^+$ type 4H—SiC single crystal is subjected to mirror polishing, and a 10 $\mu$m-thick epitaxial growth layer of n-type 4H—SiC is formed on the {0001} plane inclined at an angle (off-angle) of 8 degrees, followed by aluminum ion implantation as a p-type impurity down to a depth of about 0.3 $\mu$l from the surface of the epitaxial growth layer and then by heat treatment in an inert atmosphere at 1,700° C. for 30 minutes. Inclination at an off-angle of the crystal plane of single crystal wafer surface is the well known art in growth of high quality epitaxial layer with less defects and an off-angle is appropriately selected usually from a range of one to ten degrees. In FIG. 4, crystal defects shown by black dots (14 and 15) are observable down to about 0.3 $\mu$m in the depth direction from the surface, and the crystal defects are larger when viewed from the <11$\underline{2}$0> orientation than when viewed from the other orientation. The crystal defects are smaller when viewed from the <1100> orientation where the crystal plane in parallel to the <11$\underline{2}$0> orientation is observable than when viewed from the other orientation. Further detailed observation made by the present inventors revealed that such states of crystal defects were likewise observed in case of crystal planes approximately in parallel to the <11$\underline{2}$0> orientation within an angle deviation of about 3 degrees from the <11$\underline{2}$0> orientation.

On the other hand, as shown in the plan view of FIG. 2, the gate layer 23 is in a shape of narrow stripe, whose longitudinal direction is in parallel to the <11$\underline{2}$0> orientation on the {0001} plane as the surface of epitaxial growth layer. Thus, in the region extended in the depth direction from the surface of the epitaxial growth layer (the side of gate layer 23 in the perspective view) at the interfaces between the gate layer 23 and the drift layer 22, the crystal plane in parallel to the <11$\underline{2}$0> orientation, which is along the longitudinal direction of the gate layer 23, takes a proportion of 70 to 80%. On the other hand, the crystal plane perpendicular to the <11$\underline{2}$0> orientation is constituted by a portion of the interface, which has a curvature at the edge of the gate layer 23 in the longitudinal direction. Consequently, the crystal defects at the pn junction in the region extended in the depth direction from the surface of the epitaxial growth layer at the interface between the gate layer 23 and the drift layer 22 are substantially small ones. When an inverse voltage is applied to the pn junction, the leak current can be made smaller. Furthermore, in this embodiment, the {0001} plane as the surface of the epitaxial growth layer is in parallel to the <11$\underline{2}$0> orientation, and thus the region in parallel to the surface of the epitaxial growth layer at the interface between the gate layer 23 and the drift layer 22 (bottom of the gate layer 23 in the perspective view) also forms a crystal plane inparallel to the <11$\underline{2}$0> orientation, whereby the leak current generated in the region in parallel to the surface of the epitaxial growth layer at the interface of the gate layer 23 and the drift layer 22 can be made smaller and thus the leak current generated at the entirely of substantial pn junction can be reduced.

When an inverse bias voltage is applied between the source electrode 25 and the gate electrode 26 of the junction-gate field effect transistor of FIG. 2, a depletion layer can be extended from the pn junction at the interface between the gate layer 23 and the drift layer 22, thereby blocking the principal voltage applied between the drain electrode 27 and the source electrode 25, where the field intensity in the depletion layer is higher at the pn junction having a curvature than at the flat pn junction. In this embodiment, the pn junction in the laongitudinal direction of the gate layer 23 and also at the edge in the longitudinal direction has a curvature, and thus the field intensity can be increased. That is, when there are large crystal defects at the pn junction, the leak current will be increased. However, in this embodiment, the longitudinal direction of the gate layer 23 is in parallel to the <11$\underline{2}$0> orientation, the crystal defects at the pn junction interface having a curvature will be substantially small, giving less influences of crystal defects in the gate layer 23 upon the leak current. Furthermore, the flat region at the pn junction interface also forms a crystal plane in parallel to the <11$\bar{2}$0> direction, and thus the crystal defects at the entirety of the pn junction interface will be substantial small. That is, in this embodiment, the leak current generated at the pn junction of SiC semiconductor crystal can be made smaller.

Figure 5:
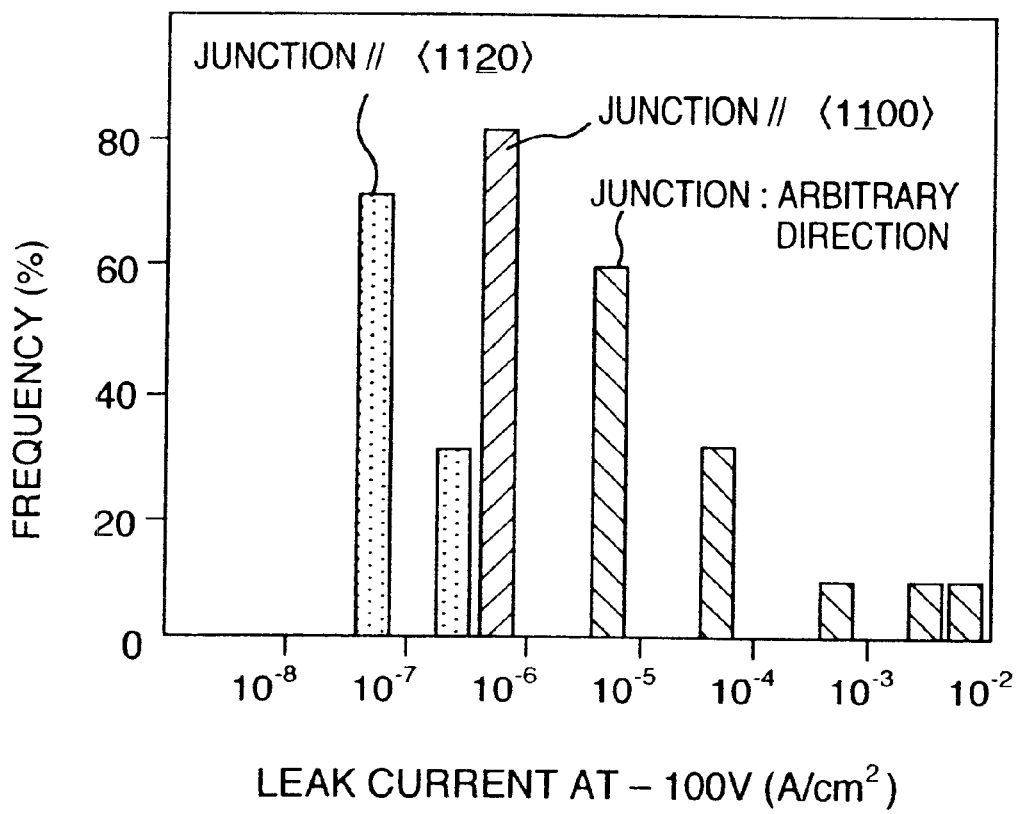
FIG. 5 is a distribution diagram of leak current at pn junctions formed in the SiC single crystal.
Figure 6A:
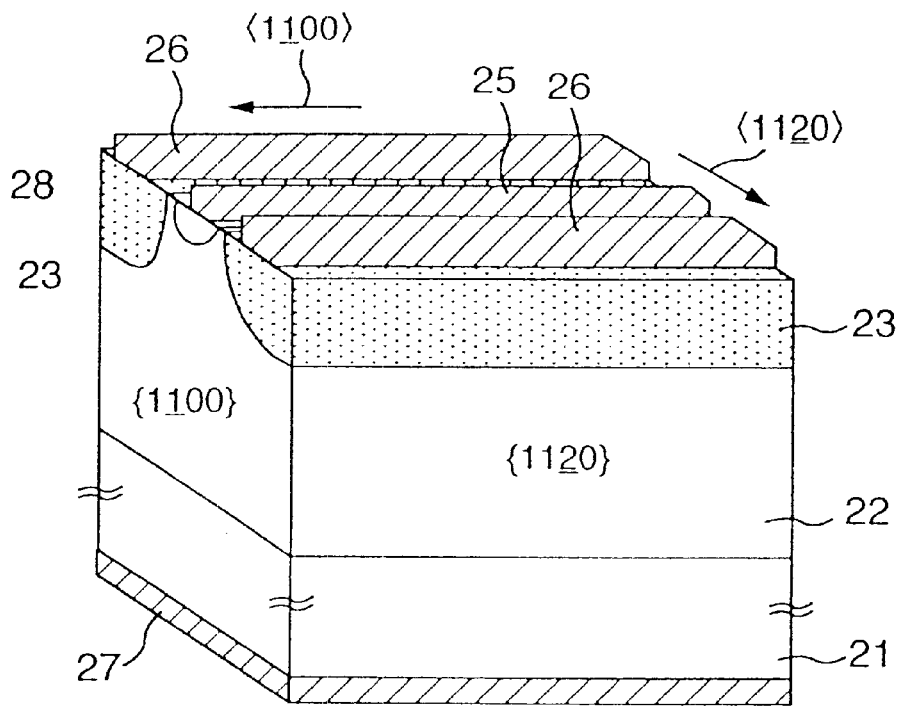
FIG. 6 is a perspective view and a plan view showing a junction-gate field effect transistor, respectively, where the pn junction interface is in parallel to the <1100> orientation.
Figure 6B:
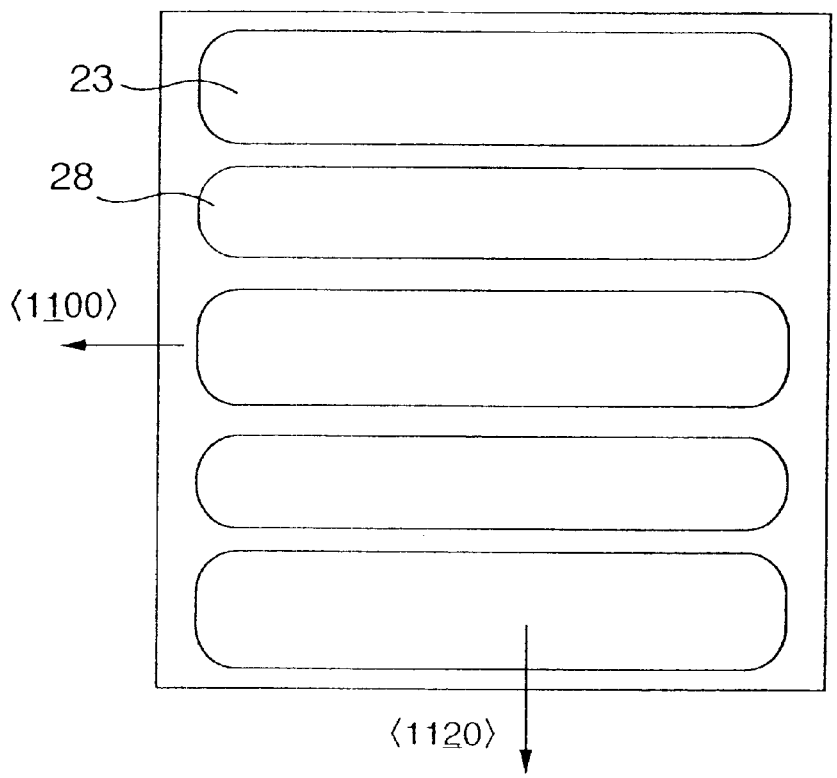

FIG. 5 shows leak current distribution when an inverse voltage is applied to various pn junctions formed in SiC single crystals. Case of pn junction interface in parallel to the <1100> orientation corresponds to the pn junction comprising a gate layer 23 and a drift layer 22 in a junction-gate field effect transistor shown in a perspective view and a plan view of FIG. 6. In FIG. 6, the gate layer 23 is formed in the direction rotated by 90 degrees from that of FIG. 2. That is, the principal pn junction interface is provided in parallel to the <1100> orientation. Among cases of pn junction in parallel to the <11$\bar{2}$0> orientation, that in parallel to the <1100> orientation, and those in arbitrary orientations, the present case in parallel to the <11$\bar{2}$0> orientation has the smallest leak current.

Figure 7A:
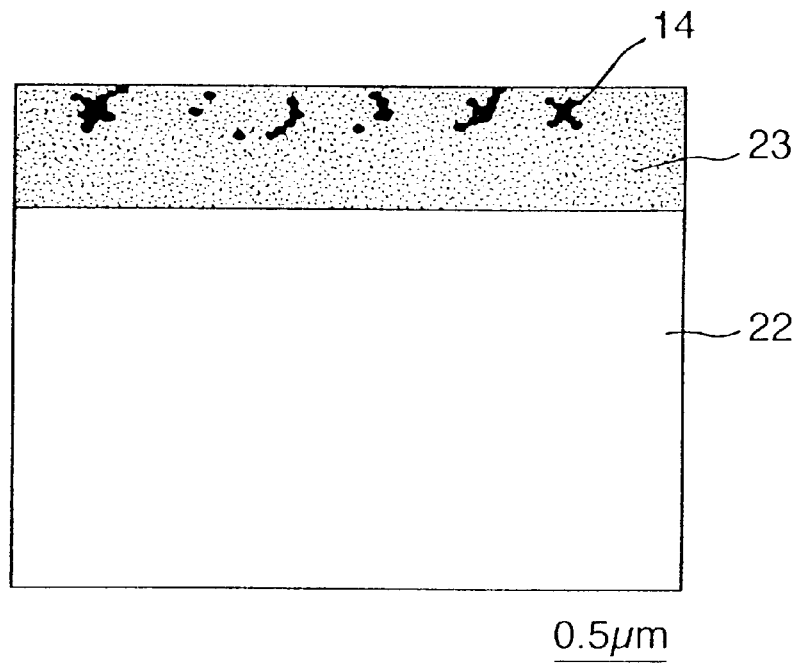
FIG. 7 is cross-sectional views each showing a pn junction formed by boron ion implantation.
Figure 7B:
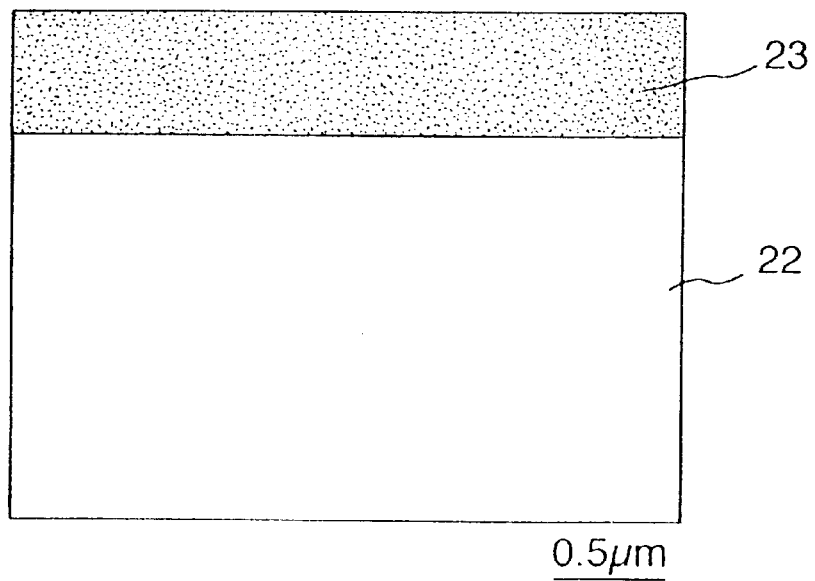

In the embodiment of FIG. 2, the gate layer 23 is formed by aluminum ion implantation, but can also be formed by other p-type impurity ion implantation. FIG. 7 shows its embodiment, where a gate layer is formed by boron ion implantation. That is, FIG. 7 is cross-sectional views of a pn junction comprising a gate layer 23 and a drift layer 22 in a junction-gate field effect transistor in the same structure as that of FIG. 2. Case of observation in the <11$\bar{2}$0> orientation of silicon carbide single crystal is shown by (a) and that in the <1100> orientation by (b). Procedure for forming the pn junction is substantially the same as that of FIG. 4, but only a difference is ion implantation of boron in place of aluminum. In FIG. 7, crystal defects shown by black dots (14) is observable down to about 0.1 μm in the depth direction from the surface, as viewed from the <11$\bar{2}$0> orientation, but substantially not as viewed from the <1100> orientation, i.e. other orientation. That is, in place of aluminum, even the boron can make the leak current generated at the pn junction small. This is also applicable to other embodiments which follow.

In the embodiment of FIG. 5, the surface of the epitaxial layer is a {1000} plane in parallel to the <11$\bar{2}$0> orientation, but may be another crystal plane, because the crystal defect density derived by the aluminum ion implantation decreases inwards in the epitaxial layer in the depth direction from the surface of the epitaxial layer, and the zone in parallel to the surface of the epitaxial layer at the pn junction corresponds to the inner-most of the aluminum ion-implanted region, so that the crystal defects in that zone have a lowest density, giving no substantial influence upon the leak current. Thus, even if the surface of the epitaxial layer is another crystal plane not in parallel to the <11$\bar{2}$0> orientation in the embodiment of FIG. 5, the leak current can be also made smaller. This is also applicable to the aforementioned case based on the boron ion implantation or to other embodiments which follow.

Figure 8A:
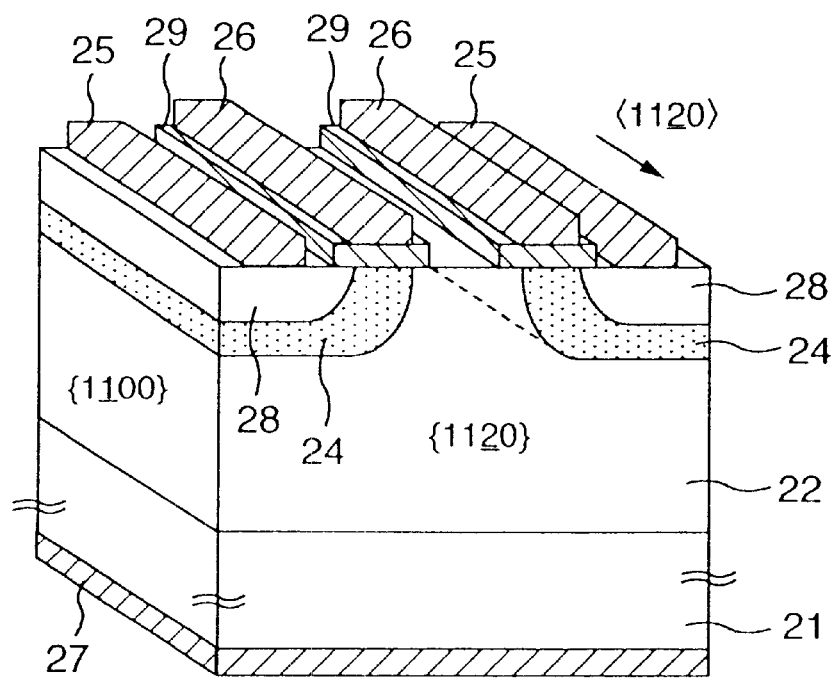
FIG. 8 is a perspective view and a plan view showing a MOS field effect transistor, respectively, according to the present invention.
Figure 8B:
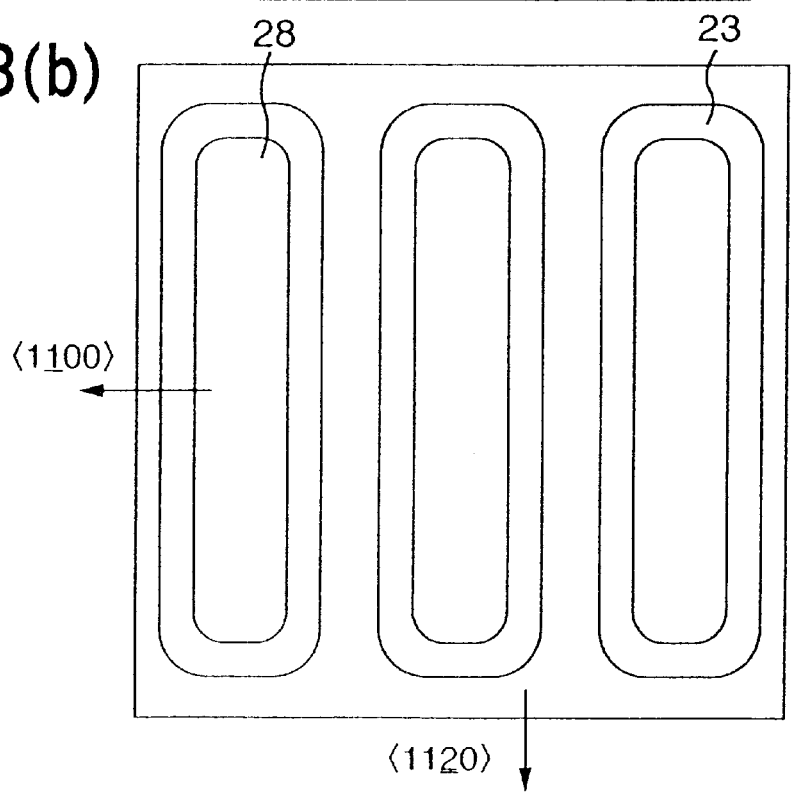

FIG. 8 is a perspective view showing application of the present invention to a MOS field effect transistor and a plan view showing only a semiconductor region. A drift layer 22 of high resistance, n-type (n⁻ type) is provided on a silicon carbide single crystal wafer 21 of low resistance n-type (n⁺ type) by epitaxial growth. A p-type channel layer 24 is provided on part of the surface of the drift layer 22 by aluminum ion implantation. The channel layer 24 is in the same stripe shape as that of the gate layer 23 in the embodiment of FIG. 2. The principal pn junction plane, which is not in parallel to the interface between the drift layer 22 and the channel layer 24, is formed in parallel to the <11$\bar{2}$0> orientation of 4H—SiC. An n⁺-type source layer 28 is provided on part of the surface of the dirft layer 22 by nitrogen ion implantation. The n⁺-type source layer is brought into ohmic contact with a source electrode 25, whereas the n⁺-type silicon carbide single crystal wafer 21 is brought into ohmic contact with a drain electrode 27. Furthermore, a gate electrode 26 is provided on the surface of the channel layer 29 through a gate insulator film 29.

In FIG. 8, when a principal voltage is applied between the drain electrode 27 and the source electrode 25 to bring the drain electrode 27 to a higher potential and when the gate electrode 26 is brought to the same potential as that of the source electrode 25, depletion layers are extended from the pn junction interface between the channel layer 24 and the drift layer 22 into the respective layers, thereby bringing the MOS field effect transistor of this embodiment into a blocking state. As already described in detail, referring to the embodiment of FIG. 2, the region extended in the depth direction from the surface of the epitaxial growth layer at the pn junction interface takes a crystal planes substantially in parallel to the <11$\bar{2}$0> orientation in that case, and thus only substantially small defects appear. That is, the leak current can be reduced also in this embodiment.

Figure 9A:
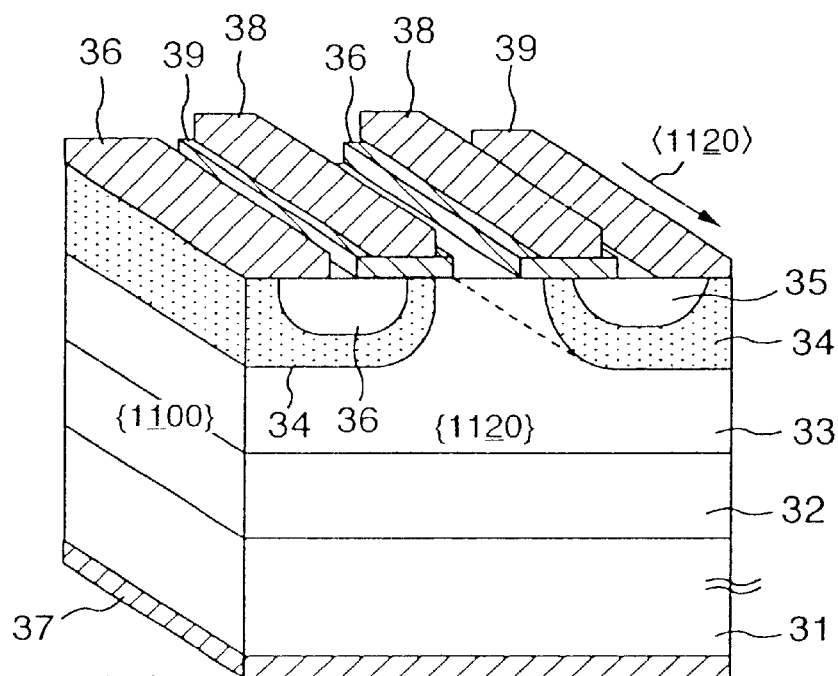
FIG. 9 is a perspective view and a plan view showing an insulated-gate bipolar transistor, respectively, according to the present invention.
Figure 9B:
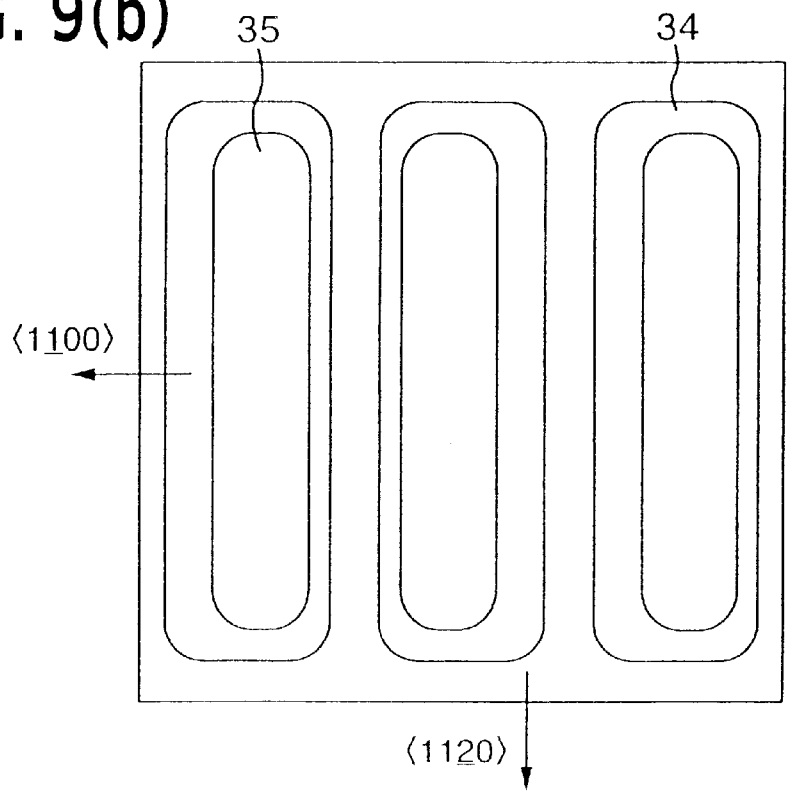

FIG. 9 is a perspective view showing application of the present invention to an insulated-gate bipolar transistor and a plan view showing only a transistor region. A layer 32 of low resistance n+-type is provided on a silicon carbide single crystal wafer 31 of low resistance p-type (p⁺ type) and successively a layer 33 of high resistance n⁻-type thereon by epitaxial growth. A p-type layer 34 is provided on part of the surface of the n⁻-type layer 33 by aluminum ion implantation. The p-type layer 34 is in the same stripe shape as those of the gate layer and the channel layer in FIG. 2 and FIG. 8, respectively, where the principal pn junction plane, which is not in parallel to the interface between the n⁻-type layer 33 and the p-type layer 34, is formed in the <11$\bar{2}$0> orientation of 4H—SiC. An n⁺-type layer 35 is provided on part of the p-type layer 34 by nitrogen ion implantation. An emitter electrode 36 is bought into ohmic contact with the p-type layer 34 and the n⁺-type layer 35, whereas a collector electrode 37 is brought into ohmic contact with the p⁺-type silicon carbide single crystal wafer 31. Furthermore, a gate electrode 38 is provided on the surface of the p⁺-type layer 34 through a gate insulator film 39.

In FIG. 9, when a principal voltage is applied between the collector electrode 37 and the emitter electrode 36 to bring the collector electrode 37 to a higher potential and when the gate electrode is brought to the same potential as that of the emitter electrode 36 or a lower potential than that of the emitter electrode 36, depletion layers are extended from the pn junction interlayer between the p-type layer 34 and the n⁻-type layer 33 into the respective layers, thereby bringing the insulated-gate bipolar transistor of this embodiment into a blocking state. As already described in detail, referring to the embodiment of FIG. 2, the region extended in the depth direction from the surface of the epitaxial growth layer at the pn junction interface takes a crystal plane substantially in parallel to the <11$\bar{2}$0> orientation in that case, and thus only substantially small defects appear. That is, the leak current can be reduced also in this embodiment.

The present invention is based on a hexagonal silicon carbide single crystal and can reduce a leak current of a semiconductor device with a pn junction and can considerably improve the reliability.

What is claimed is:

1. A semiconductor switching device, which comprises a silicon carbide single crystal of hexagonal symmetry having a first conductive type and a semiconductor region having a second conductive type opposite to the first conductive type and locating in the silicon carbide single crystal, characterized in that a pn junction interface between the silicon carbide single crystal and the semiconductor region, extended in the depth direction from the surface of the silicon carbide single crystal, includes a crystal plane in parallel to the <११२̄0> orientation or approximately in parallel thereto.

2. A semiconductor switching device according to claim 1, characterized in that the crystal plane has a larger area than a half of the pn junction interface.

3. A semiconductor switching device according to claim 1, characterized in that when the semiconductor switching device is in a principal voltage blocking state, a depletion layer is extended into the semiconductor region from the pn junction.

4. A semiconductor switching device according to claim 1, characterized in that the second conductive type impurity in the semiconductor region is introduced into the silicon carbide single crystal by ion implantation.

5. A semiconductor switching device according to claim 1, characterized in that the surface is a crystal plane in parallel to the <११२̄0> orientation or approximately in parallel thereto.

6. A semiconductor switching device according to claim 5, characterized in that the surface is a {0001} crystal plane or a {0001} crystal plane inclined at an angle ranging from 1 degree to 10 degrees.

7. A semiconductor switching device according to claim 5, characterized in that the semiconductor regions is in contact with the surface and is extended in the depth direction from the surface.

8. A semiconductor switching device according to claim 7, characterized in that the semiconductor region is in a stripe shape in parallel to the surface in the longitudinal direction.

9. A semiconductor switching device according to claim 8, characterized in that the longitudinal direction is in parallel to the <११२̄0> orientation or approximately in parallel thereto.

10. A semiconductor switching device according to claim 1, characterized in that the second conductive type impurity in the semiconductor region is aluminum or boron.

* * * * *